United States Patent [19]
Wu

[11] Patent Number: 5,905,281
[45] Date of Patent: May 18, 1999

[54] DRAW CELL WITH A FORK-SHAPED CAPACITOR

[75] Inventor: Shye-Lin Wu, Hsinchu, Taiwan

[73] Assignee: Texas Instruments-Acer Incorporated, Hsinchu, Taiwan

[21] Appl. No.: 09/013,690

[22] Filed: Jan. 26, 1998

[51] Int. Cl.⁶ .................................................. H01L 27/108
[52] U.S. Cl. ............................................ 257/309; 257/306
[58] Field of Search ..................................... 257/306, 307, 257/308, 309; 438/396, 397, 398, 239, 250, 253

[56] References Cited

U.S. PATENT DOCUMENTS

| 5,266,512 | 11/1993 | Kirsch | 438/396 |
| 5,491,103 | 2/1996 | Ahn et al. | 438/396 |
| 5,643,819 | 7/1997 | Tseng | 438/396 |
| 5,744,833 | 4/1998 | Chao | 257/308 |

FOREIGN PATENT DOCUMENTS

| 6-021382 | 1/1994 | Japan | 257/308 |
| 6-021393 | 2/1994 | Japan | 257/308 |

*Primary Examiner*—David B. Hardy
*Attorney, Agent, or Firm*—Harness, Dickey & Pierce, P.L.C.

[57] ABSTRACT

A fork-shaped capacitor of a dynamic random access memory cell is disclosed. This capacitor includes a semiconductor layer (110), and a first dielectric layer (119) formed over the semiconductor layer. The capacitor also includes a first doped region (118) formed on a portion of the first dielectric layer, the first doped region communicating to the semiconductor layer via a hole in the first dielectric layer. At least two second doped regions (122) are formed on the first doped region, each of the doped regions being spaced from each other. Further, at least two third doped regions (126) are formed on the first dielectric layer, each of the third doped regions being spaced from each other, each of the third doped regions being spaced from each of the second doped regions, wherein a portion of each of the third doped regions abuts a sidewall of the first doped region. Finally, the capacitor includes a second dielectric film (136) formed on surface of the first doped region, the second doped regions, and the third doped regions; and a conductive layer (138) formed on the second dielectric film.

13 Claims, 5 Drawing Sheets

DRAW CELL WITH A FORK-SHAPED CAPACITOR

BACKGROUND OF THE INVENTION

1. Field of the Invention

The present invention relates to dynamic random access memory (DRAM) fabrication, and more particularly, to a dynamic random access memory cell with a fork-shaped capacitor.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

SUMMARY OF THE INVENTION

In accordance with the present invention, a fork-shaped capacitor of a dynamic random access memory cell is disclosed that substantially increases the surface of the capacitor. In one embodiment, the capacitor includes a semiconductor layer, and a first dielectric layer formed over the semiconductor layer. The capacitor also includes a silicon oxide layer formed on the first dielectric layer, wherein the silicon oxide layer includes a top surface. A first doped polysilicon region is formed on a portion of the silicon oxide layer, wherein the first doped region includes a top surface, and the first doped polysilicon region communicates to the semiconductor layer via a hole in the silicon oxide layer and the first dielectric layer. Further, a pair of second doped polysilicon regions abutting the top surface of the first doped region is provided, each of the pair of second doped polysilicon regions being spaced from each other. A pair of third doped polysilicon regions abutting the top surface of the first dielectric layer is also provided, each of the pair of third doped polysilicon regions being spaced from each other, each of the pair of third doped polysilicon regions being spaced from each of the pair of second doped polysilicon regions, wherein a portion of each of the pair of third doped polysilicon regions abuts a sidewall of the first doped polysilicon region. Finally, a second dielectric film is formed on surface of the first doped polysilicon region, the pair of second doped polysilicon regions, and the pair of third doped polysilicon regions; and a conductive layer is formed on the second dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
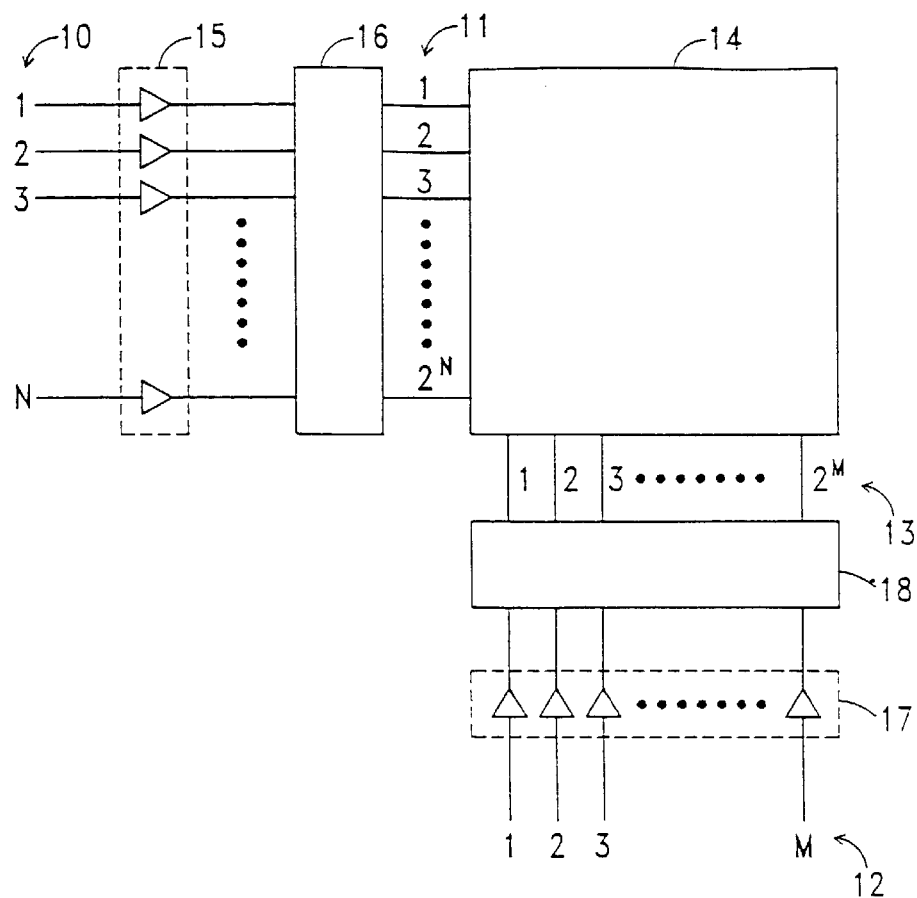
FIG. 1 shows a simplified diagram illustrative of the organization of a typical large semiconductor memory.
Figure 2A:
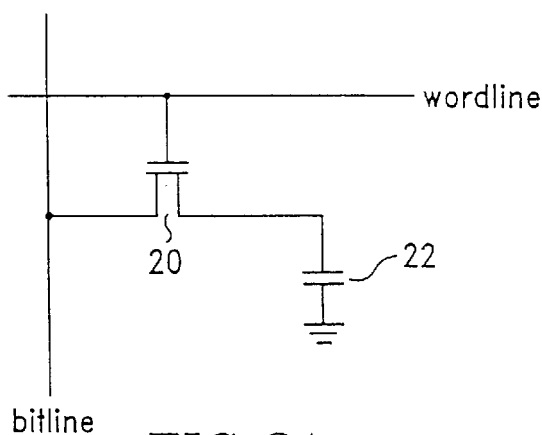
FIG. 2A shows a circuit schematic diagram of a typical one-transistor dynamic random access memory (DRAM) cell.
Figure 2B:
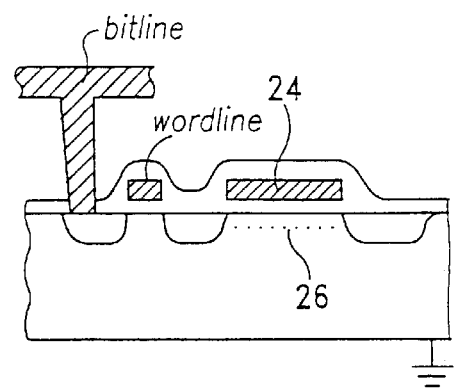
FIG. 2B shows a cross-sectional view illustrative of traditional one-transistor DRAM storage cell.
Figure 3:
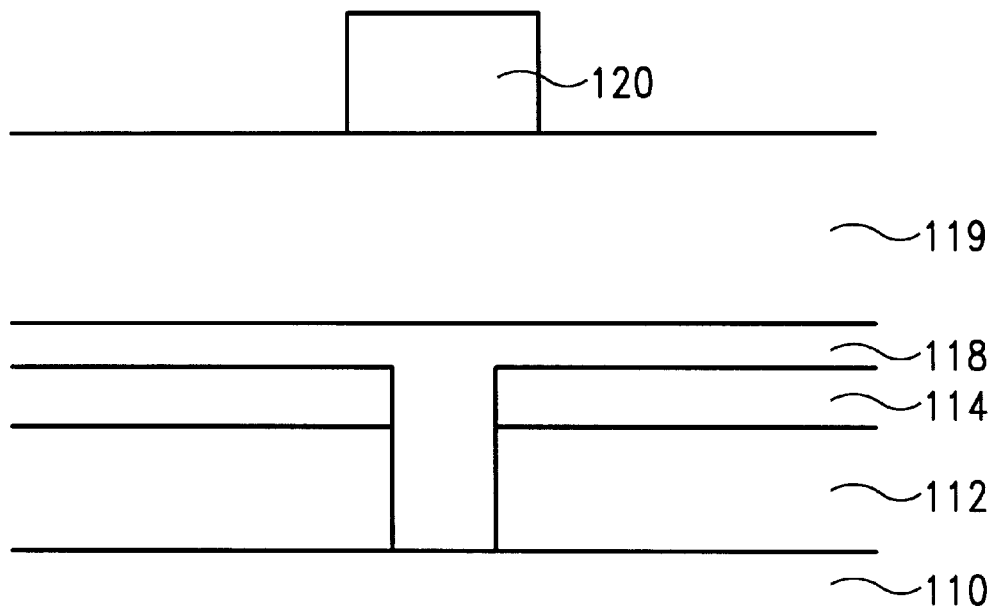
FIGS. 3–10 show cross-sectional views illustrative of various stages in the fabrication of a DRAM capacitor in accordance with the present invention.

FIG. 3 shows a cross-sectional view illustrative of a portion of a dynamic random access memory (DRAM) cell in accordance with one embodiment of the present invention, wherein a dielectric layer 112, such as silicon nitride tetraethylorthosilicate (TEOS) or borophosphosilicate glass (BPSG), is deposited on a semiconductor substrate 110. A silicon oxide layer 114 is then deposited on the dielectric layer 112. In this embodiment, this silicon oxide layer 114 is deposited using a conventional low pressure chemical vapor deposition (LPCVD) or plasma enhanced chemical vapor deposition (PFCVD) process. The thickness of this silicon oxide layer 114 can range from about 1000 to 10000 angstroms. It is noted that a contact hole 116 is also formed in the silicon oxide layer 114 and the dielectric layer 112 so that a portion of the substrate 110, such as a source region, is exposed.

A doped polysilicon layer 118 is then formed on the silicon oxide layer 114, therefore filling the contact hole 116. In this embodiment, the polysilicon layer 118 is deposited using a standard chemical vapor deposition process to a thickness of about 1000–6000 angstroms above the surface of the silicon oxide layer 114. A dielectric layer 119, such as silicon nitride, is deposited on the doped polysilicon layer 118 to a thickness of about 3000–10000 angstroms. In this embodiment, the silicon nitride layer 119 is deposited using a conventional low pressure chemical vapor deposition (LPCVD) or plasma enhanced chemical vapor deposition (PECVD).

Figure 4:
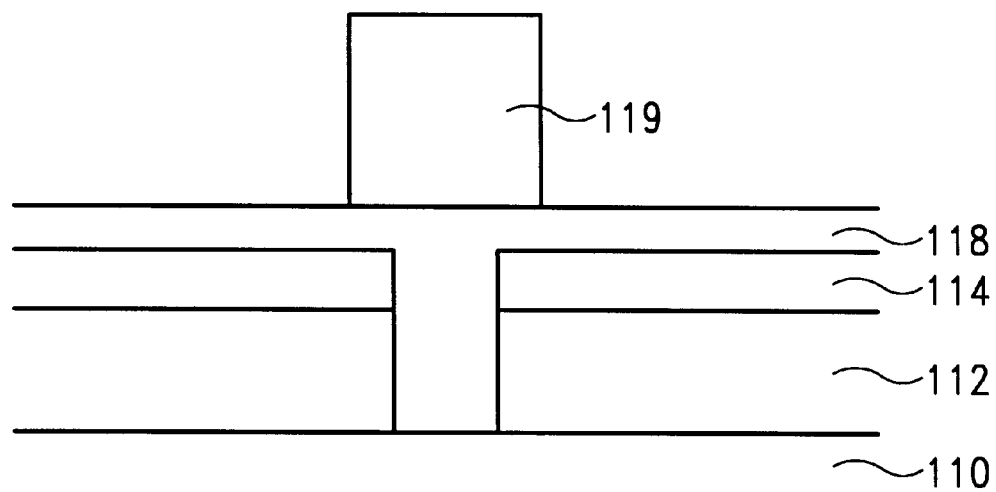

A photoresist layer 120 is then formed and patterned on the silicon nitride 119 using conventional photolithographic techniques, defining a storage node region using conventional etch process in the silicon nitride layer 119 as shown in FIG. 4.

Figure 5:
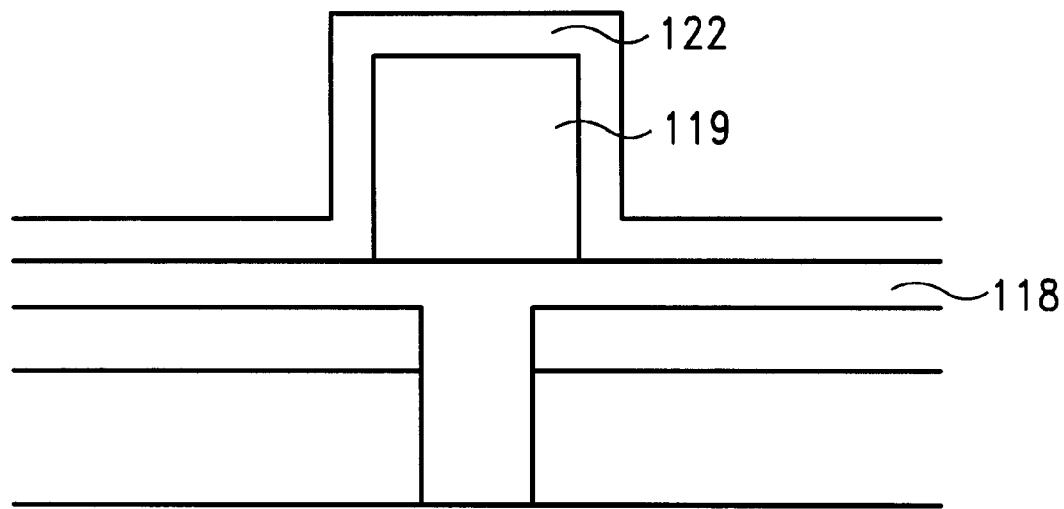

After the photoresist layer 120 is removed, a second polysilicon layer 122 is deposited on the silicon nitride layer 119 and the doped polysilicon layer 118 as shown in FIG. 5. In this embodiment, the second polysilicon layer 122 is preferably formed in the same manner as the doped polysilicon layer 188, and has a thickness of about 300–3000 angstroms.

Figure 6:
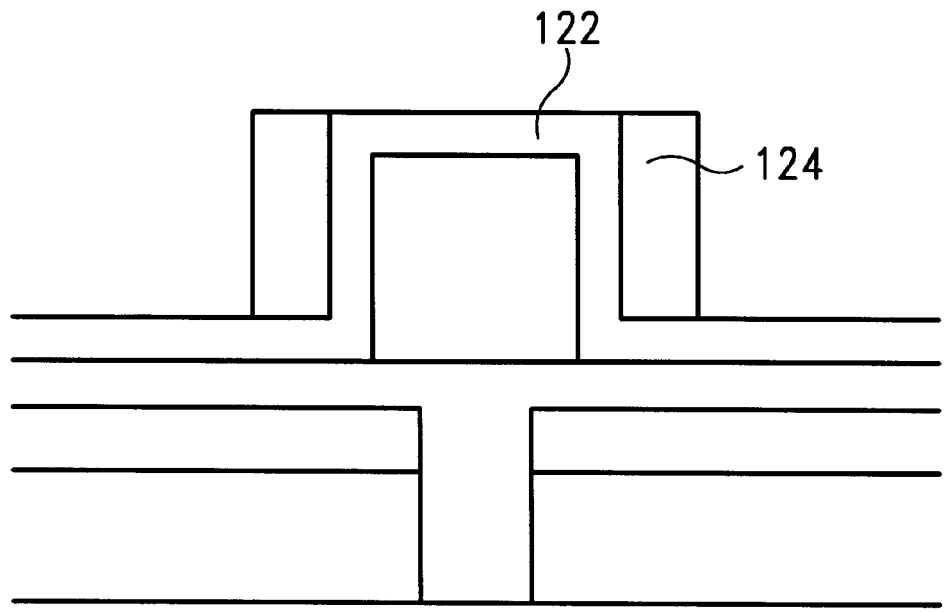

Next, referring to FIG. 6, a dielectric spacer 124, such as silicon nitride spacer, is formed on the sidewall of the second polysilicon layer 122. This silicon nitride spacer 124 is preferably formed by firstly blanket depositing a silicon nitride layer 124 over the second polysilicon layer 122, followed by etching back to form the silicon nitride spacer 124. In this embodiment, the silicon nitride layer 124 is deposited using a conventional low pressure chemical vapor deposition (LPCVD) or plasma enhanced chemical vapor deposition (PECVD).

Figure 7:
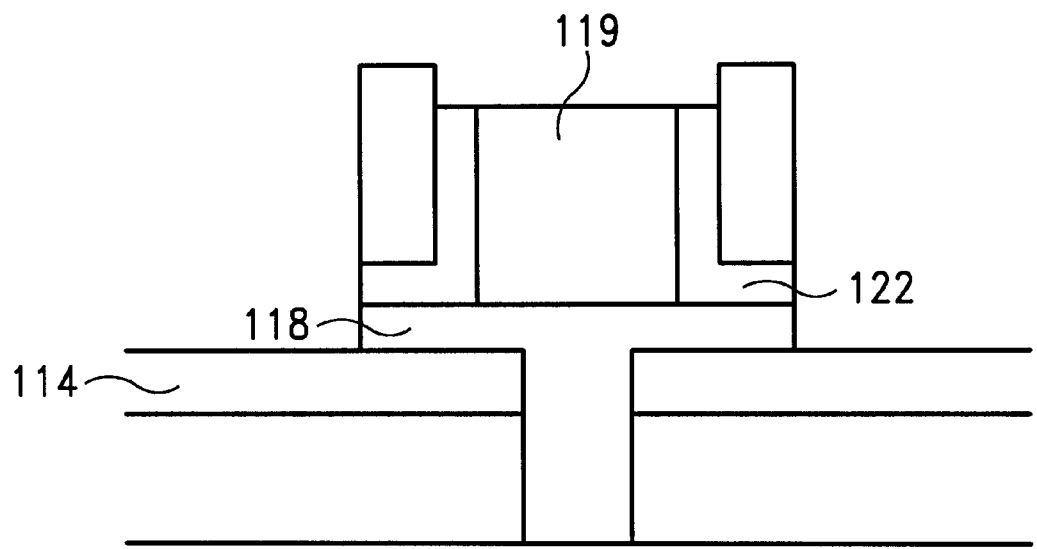

Referring to FIG. 7, the second polysilicon layer 122 and the doped polysilicon layer 118 are etched back using the silicon nitride layer 124 as a mask until the surfaces of the silicon nitride layer 119 and the silicon oxide layer 114 are exposed. The etching of the second polysilicon layer 122 and the doped polysilicon layer 118 is preferably done, for example, by a plasma etching process in this embodiment.

Figure 8:
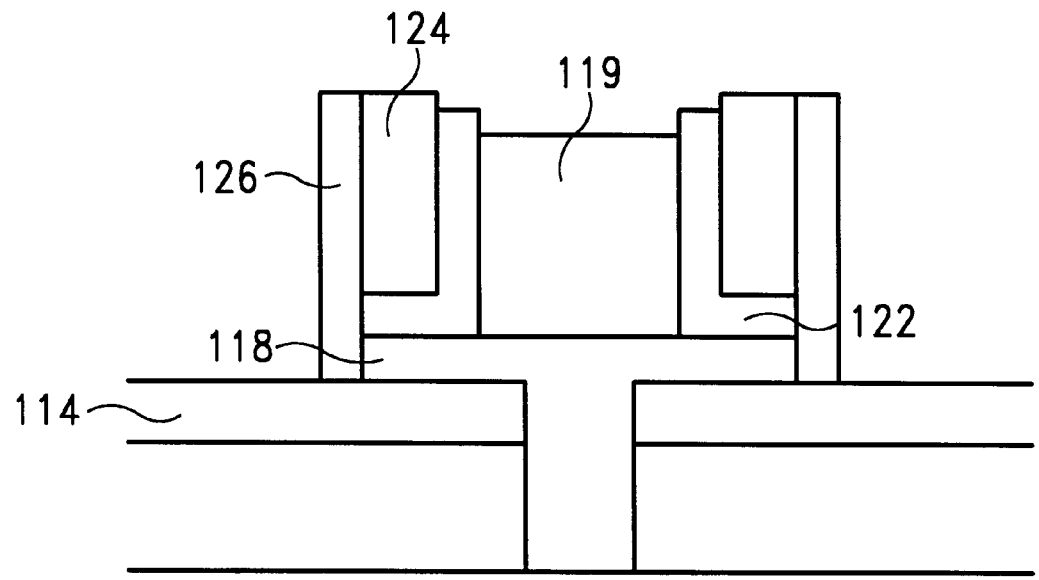

A third polysilicon spacer 126 is formed on the sidewalls of the silicon nitride spacer 124, the second polysilicon layer 122, and the doped polysilicon layer 118 as shown in FIG. 8. This third polysilicon spacer 126 is preferably formed by firstly blanket depositing a polysilicon layer 126 over the structure of FIG. 7, followed by etching back to form the third polysilicon spacer 126. In this embodiment, the polysilicon layer 126 is preferably formed in the same manner as the doped polysilicon layer 118, and has a thickness of about 300–3000 angstroms.

Figure 9:
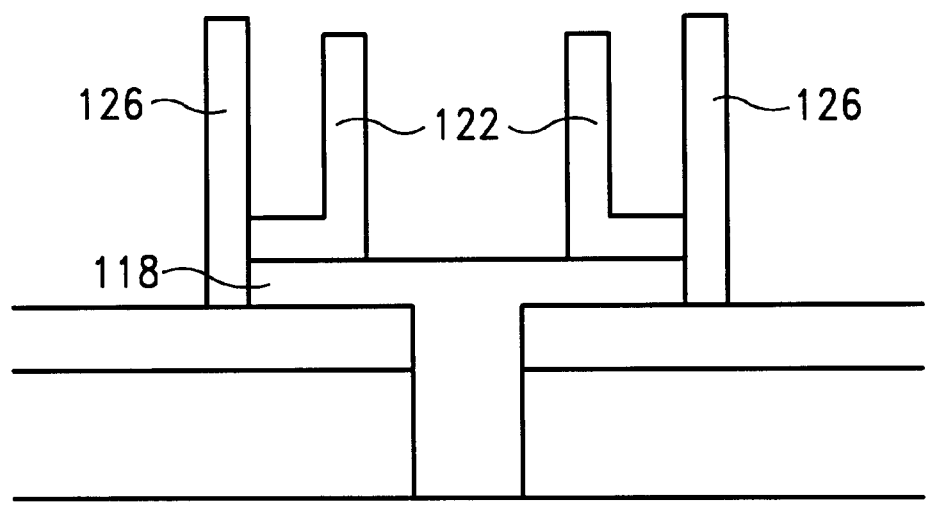

After removing the silicon nitride layer 119 and the silicon nitride layer 124, for example, by hot phosphoric acid ($H_3PO_4$) solution, a fork-shaped bottom electrode of the DRAM cell is thus formed as shown in FIG. 9.

Figure 10:
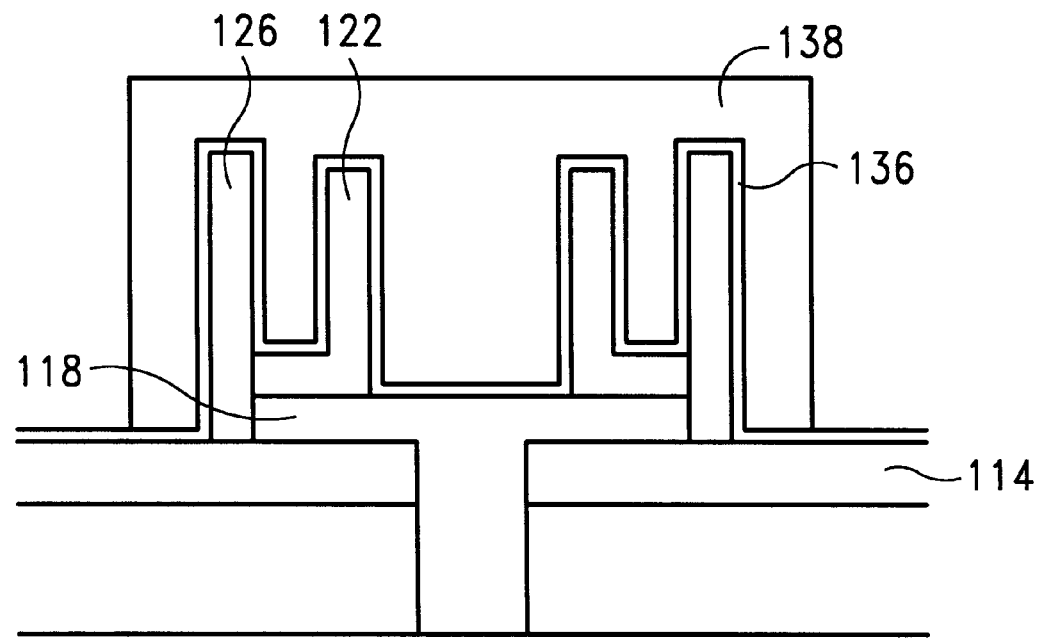

Referring to FIG. 10, a dielectric film 136 and a top electrode 138 of the DRAM cell capacitor can then be formed in the conventional manner. In this embodiment, a thin dielectric layer 136, such as stacked oxide-nitride-oxide (ONO) film, is formed on the exposed surface of the bottom electrode (i.e., the storage node including polysilicon 118, 122, and 126) and the surface of the silicon oxide layer 114. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. Other material, such as NO, $Ta_2O_5$, $TiO_2$, PZT, or BST can be used as the thin dielectric layer 136. A conductive layer 138 is then deposited over the stack oxide/silicon nitride/oxide layer 136 to serve as an upper plate of the DRAM cell capacitor. Typically, the conductive layer 138 is a doped polysilicon layer formed in the same manner as the polysilicon layer 118. Other material, such as metal or silicide, can be used as the conductive layer 138.

Although specific embodiments have been illustrated and described, it will be obvious to those skilled in the art that various modifications may be made without departing from the spirit which is intended to be limited solely by the appended claims.

What is claimed is:

1. A capacitor of a dynamic random access memory cell, said capacitor comprising:

a semiconductor layer;

a first dielectric layer formed over said semiconductor layer;

a silicon oxide layer formed on said first dielectric layer;

a first doped region formed on a portion of said silicon oxide layer, said first doped region communicating to said semiconductor layer via a hole in said first dielectric layer;

at least two second doped regions formed on said first doped region, each of said at least two second doped regions being spaced from each other;

at least two third doped regions formed on said silicon oxide layer, each of said at least two third doped regions being spaced from each other, each of said at least two third doped regions being spaced from each of said at least two second doped regions, wherein a portion of each of said at least two third doped regions abuts a sidewall of said first doped region;

a second dielectric film formed on surface of said first doped region, said at least two second doped regions, and said at least two third doped regions; and a conductive layer formed on said second dielectric film.

2. The capacitor according to claim 1, wherein said first dielectric layer comprises silicon nitride.

3. The capacitor according to claim 1, wherein said first doped region comprises doped polysilicon.

4. The capacitor according to claim 3, wherein said second doped region comprises doped polysilicon.

5. The capacitor according to claim 4, wherein said third doped region comprises doped polysilicon.

6. The capacitor according to claim 1, wherein said second dielectric film comprises an element chosen from the group consisting of oxide-nitride-oxide (ONO), NO, $Ta_2O_5$, $TiO_2$, PZT, and BST.

7. The capacitor according to claim 1, wherein said conductive layer comprises an element chosen from the group consisting of doped polysilicon, metal and silicide.

8. A capacitor of a dynamic random access memory cell, said capacitor comprising:

a semiconductor layer;

a first dielectric layer formed over said semiconductor layer;

a silicon oxide layer formed on said first dielectric layer, said silicon oxide layer including a top surface;

a first doped polysilicon region formed on a portion of said silicon oxide layer, said first doped region including a top surface, said first doped polysilicon region communicating to said semiconductor layer via a hole in said silicon oxide layer and said first dielectric layer;

a pair of second doped polysilicon regions abutting the top surface of said first doped region, each of said pair of second doped polysilicon regions being spaced from each other;

a pair of third doped polysilicon regions abutting the top surface of said first dielectric layer, each of said pair of third doped polysilicon regions being spaced from each other, each of said pair of third doped polysilicon regions being spaced from each of said pair of second doped polysilicon regions, wherein a portion of each of said pair of third doped polysilicon regions abuts a sidewall of said first doped polysilicon region;

a second dielectric film formed on surface of said first doped polysilicon region, said pair of second doped polysilicon regions, and said pair of third doped polysilicon regions; and a conductive layer formed on said second dielectric film.

9. The capacitor according to claim 8, wherein said first dielectric layer comprises silicon nitride.

10. The capacitor according to claim 8, wherein said second dielectric film comprises an element chosen from the group consisting of oxide-nitride-oxide (ONO), NO, $Ta_2O_5$, $TiO_2$, PZT, and BST.

11. The capacitor according to claim 8, wherein said conductive layer comprises an element chosen from the group consisting of doped polysilicon, metal and silicide.

12. The capacitor according to claim 8, wherein said first dielectric layer comprises tetraethylorthosilicate (TEOS).

13. The capacitor according to claim 8, wherein said first dielectric layer comprises boro-phosphosilicate glass (BPSG).

* * * * *